United States Patent
Chida et al.

(10) Patent No.: US 10,939,585 B2
(45) Date of Patent: Mar. 2, 2021

(54) FIXING STRUCTURE OF ELECTRONIC COMPONENT

(71) Applicant: Yazaki Corporation, Tokyo (JP)

(72) Inventors: Chiaki Chida, Shizuoka (JP); Michito Enomoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 64 days.

(21) Appl. No.: 15/960,729

(22) Filed: Apr. 24, 2018

(65) Prior Publication Data

US 2018/0376613 A1  Dec. 27, 2018

(30) Foreign Application Priority Data

Jun. 23, 2017  (JP) .............................. JP2017-123551

(51) Int. Cl.
*H05K 7/20* (2006.01)
*H01L 23/40* (2006.01)
*F16B 2/06* (2006.01)
*F16B 5/06* (2006.01)

(52) U.S. Cl.
CPC ........... *H05K 7/2049* (2013.01); *F16B 2/065* (2013.01); *H01L 23/4006* (2013.01); *H05K 7/20* (2013.01); *H05K 7/209* (2013.01); *H05K 7/2039* (2013.01); *F16B 5/0642* (2013.01); *H01L 2023/4037* (2013.01)

(58) Field of Classification Search
CPC ...... H05K 7/20; H05K 7/2039; H05K 7/2049; H01L 23/4006; H01L 2023/4037; F16B 5/0642
USPC ............................................................ 361/704
See application file for complete search history.

(56) References Cited

U.S. PATENT DOCUMENTS

| | | | |
|---|---|---|---|
| 5,648,889 A | 7/1997 | Bosli | |
| 2005/0128713 A1* | 6/2005 | Schmidberger | H01L 23/4006 361/719 |
| 2006/0176453 A1* | 8/2006 | Miyamoto | G03B 21/16 353/119 |
| 2006/0261457 A1* | 11/2006 | Rancuret | H01L 23/4006 257/679 |
| 2009/0168360 A1* | 7/2009 | Negrut | H01L 23/4006 361/710 |

(Continued)

FOREIGN PATENT DOCUMENTS

WO  2008/099554 A1  8/2008

*Primary Examiner* — Anatoly Vortman
*Assistant Examiner* — Zhengfu J Feng
(74) *Attorney, Agent, or Firm* — Sughrue Mion, PLLC

(57) ABSTRACT

An electronic component unit includes a heatsink, a substrate on which electronic component is installed, a fixing metal fitting that fixes the electronic component and the substrate to the heatsink, and a fastening member that fixes the fixing metal fitting to the heatsink, and the heatsink includes a body portion, and a fixing portion that is projecting from the body portion toward the substrate side and to which the fixing metal fitting is fixed, and the substrate includes a through-hole that the fixing portion penetrates through, and the fixing metal fitting includes a base portion that contacts the fixing portion and is fixed to the fixing portion by the fastening member, and a pressing portion that extends from one end of the base portion, elastically deforms with respect to the base portion, and presses the electronic component toward the substrate side.

7 Claims, 3 Drawing Sheets

(56) References Cited

U.S. PATENT DOCUMENTS

2010/0309635 A1   12/2010   Sasaki et al.

* cited by examiner

FIXING STRUCTURE OF ELECTRONIC COMPONENT

CROSS-REFERENCE TO RELATED APPLICATION(S)

The present application claims priority to and incorporates by reference the entire contents of Japanese Patent Application No. 2017-123551 filed in Japan on Jun. 23, 2017.

BACKGROUND OF THE INVENTION

1. Field of the Invention

The present invention relates to a fixing structure of electronic components.

2. Description of the Related Art

Conventionally, electronic components such as transistors have been used for a switching power-supply device such as a DC-DC converter. Because the electronic components are members that produce heat at a high temperature in operation, the electronic components are pressed and fixed to a heatsink having a heat dissipating function by a fixing metal fitting.

For example, the fixing metal fitting of International Publication WO2008/099554 discloses a technology of clamping a heatsink, a substrate, and an electronic component by a pair of fixing metal fittings, in a state in which a projecting portion of the heatsink that penetrates through the substrate and the electronic component are brought into contact.

However, in a fixing structure of common electronic components, as a fixing metal fitting is inserted toward the inner side of the substrate from the outer circumferential end portion of the substrate, clamping is performed by sandwiching the substrate between the electronic component and the heatsink and pressing these in a direction of coming closer to each other. Accordingly, as the electronic component needs to be arranged on the outer circumferential end portion side of the substrate, the degree of freedom in the arrangement of electronic components with respect to the substrate has been low. In addition, in the example of WO2008/099554, although the electronic component and the heatsink are in contact, because the electronic component is not actively pressed against the substrate, there has been a possibility that the positional deviation between the electronic component and the substrate occurs.

SUMMARY OF THE INVENTION

The present invention has been made in view of the above-mentioned circumstances, and a purpose of the present invention is to provide a fixing structure of electronic components capable of improving the degree of freedom in the arrangement of electronic components with respect to the substrate and reliably fixing the electronic components to the substrate.

According to one aspect of the present invention, a fixing structure of an electronic component includes a heatsink, a substrate on which at least one electronic component is disposed, a fixing metal fitting that fixes the at least one electronic component and the substrate to the heatsink, and a fastening member that fixes the fixing metal fitting to the heatsink. The heatsink includes a body portion, and a fixing portion projecting from the body portion toward a substrate side and to which the fixing metal fitting is fixed, the substrate includes a through-hole through which the fixing portion penetrates in a state in which the substrate is placed on the body portion, and the fixing metal fitting includes a base portion that contacts the fixing portion and is fixed to the fixing portion by the fastening member, and a pressing portion that extends from one end of the base portion, elastically deforms with respect to the base portion, and presses the at least one electronic component toward the substrate side.

According to another aspect of the present invention, in the fixing structure of the electronic component, the at least one electronic component includes at least one set of electronic components that interpose the through-hole in the substrate therebetween, and the pressing portion includes a set of pressing members that are formed on the base portion for the respective electronic components.

According to still another aspect of the present invention, in the fixing structure of the electronic component, out of a surface on the base portion side of the fixing portion and a surface on the fixing portion side of the base portion, a projecting portion is formed on either one of the surfaces and a recessed portion to which the projecting portion fits is formed on the other surface, and the recessed portion of at least one set and the projecting portion of at least one set are formed.

According to still another aspect of the present invention, in the fixing structure of the electronic component, the fixing portion has a rotation regulating shape that regulates rotation of the substrate with respect to the fixing portion, in a state in which the through-hole is penetrated.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes an exemplary embodiment of a fixing structure of electronic components according to the present invention in detail based on the accompanying drawings. The invention, however, is not intended to be limited by the embodiment.

Embodiment

Figure 1:
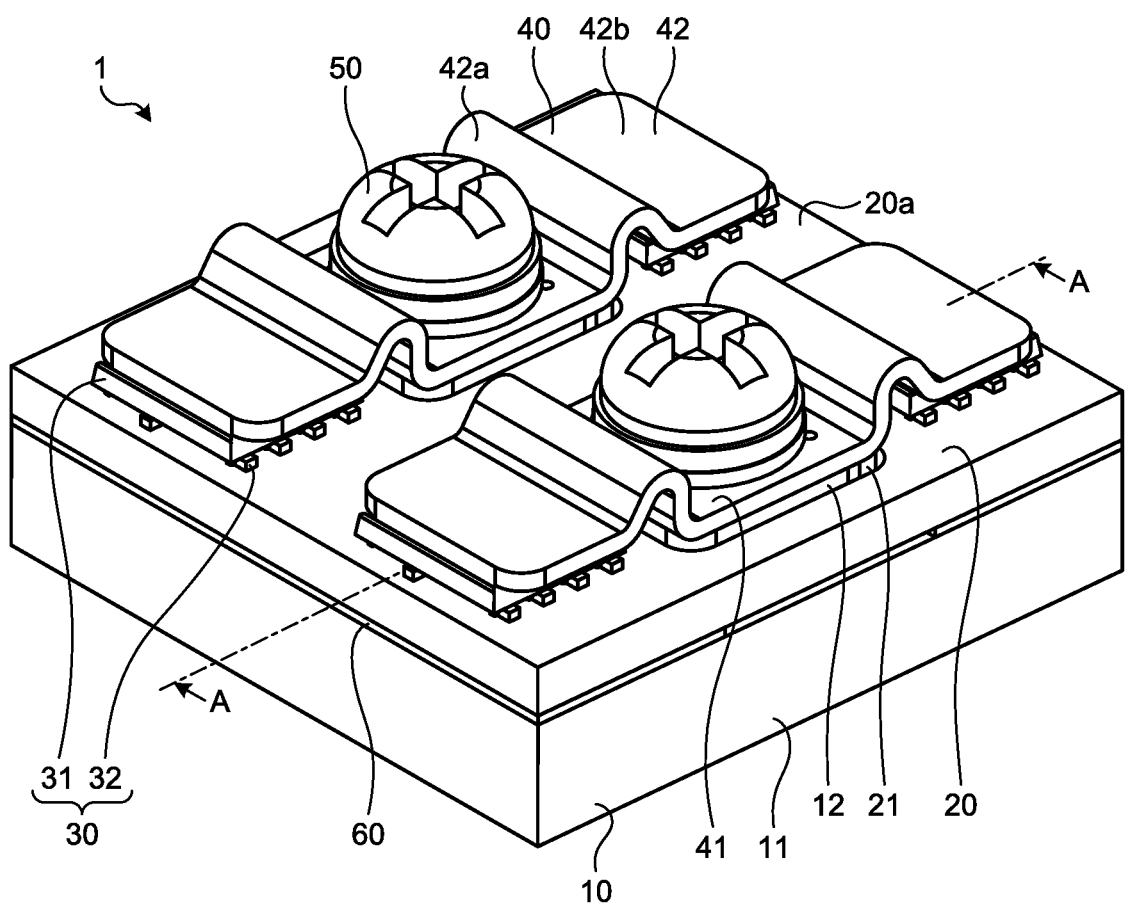
FIG. 1 is a perspective view representing a schematic configuration of an electronic component unit.
Figure 1:
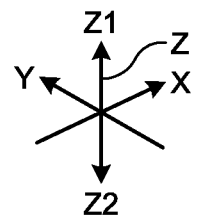
Figure 2:
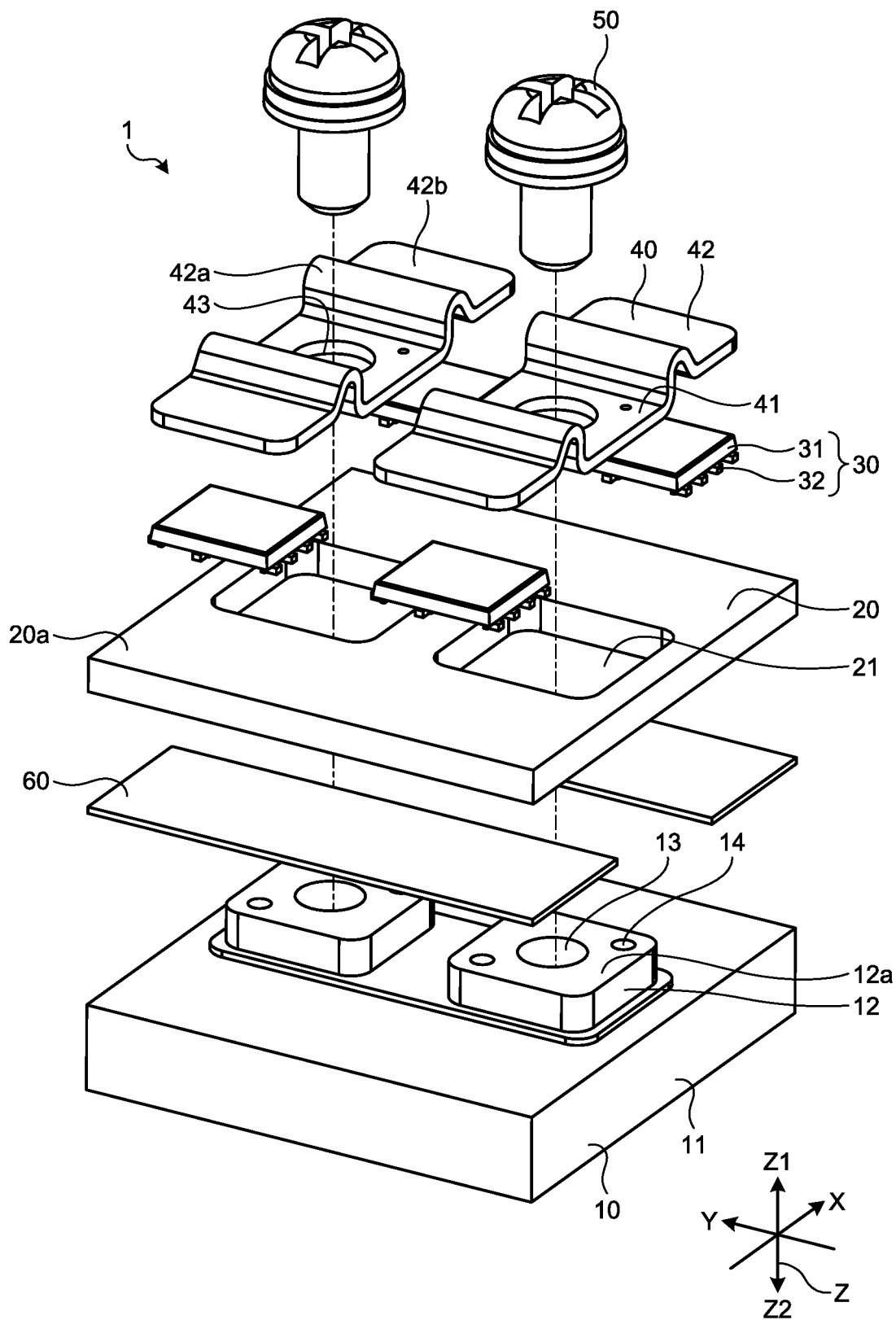
FIG. 2 is an exploded perspective view of the electronic component unit.
Figure 3:
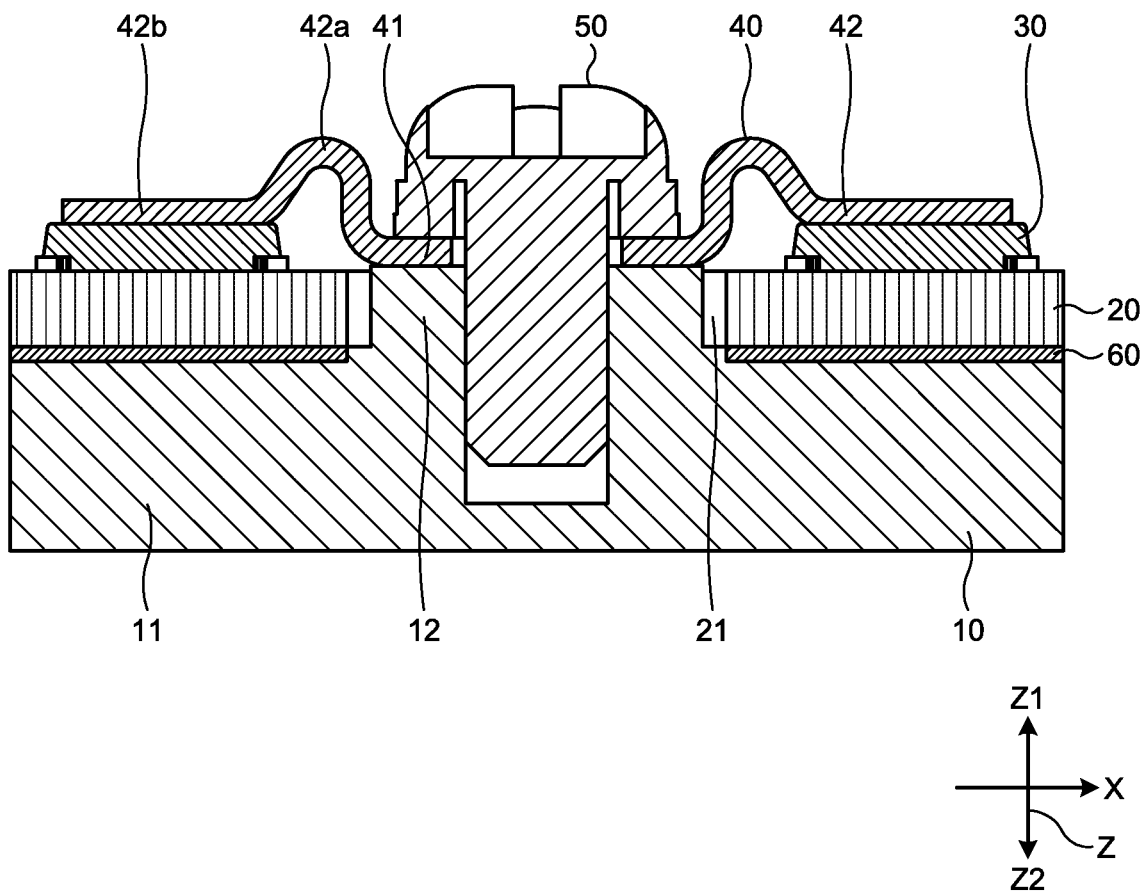
FIG. 3 is a longitudinal sectional view taken along the line A-A of the electronic component unit illustrated in FIG. 1.
Figure 4:
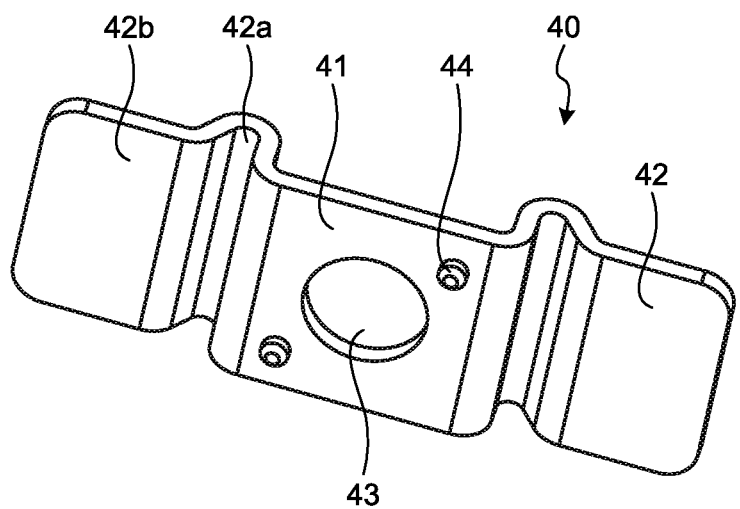
FIG. 4 is a perspective view of a fixing metal fitting viewed from a lower direction.

FIG. 1 is a perspective view representing a schematic configuration of an electronic component unit according to the invention. FIG. 2 is an exploded perspective view of the electronic component unit. FIG. 3 is a longitudinal sectional view of the line A-A indicated in FIG. 1. FIG. 4 is a perspective view of a fixing metal fitting viewed from a lower direction.

In the following description, an arrow X direction of the respective drawings is an extending direction and is a depth direction of the electronic component unit. An arrow Y direction of the respective drawings is an orthogonal direction orthogonal to the extending direction and is a width direction of the electronic component unit. An arrow Z direction of the respective drawings is a vertical direction orthogonal to the extending direction and the orthogonal direction, and a Z1 direction is an upper direction and a Z2 direction is a lower direction.

An electronic component unit 1 according to the present embodiment, as illustrated in FIGS. 1 and 2, constitutes a switching power-supply device installed in a vehicle such as an automobile, for example. The switching power-supply device, for example, a DC-DC converter or the like, having a function of converting input direct current (DC) electric power into DC electric power of a certain voltage. As for the constituent elements that constitute the switching power-supply device other than the electronic component unit 1, the description thereof is omitted.

The electronic component unit 1 is made up of a heatsink 10, a substrate 20, electronic components 30 (four, in the examples in FIGS. 1 and 2), fixing metal fittings 40 (two, in the examples), fastening members 50 (two, in the examples), and heat dissipating sheets 60 (two, in the examples).

The heatsink 10 is a fixed member on which the substrate 20 and the heat dissipating sheets 60 are placed and to which the fixing metal fittings 40 are fixed. The heatsink 10 functions as a heat dissipating member that aids heat dissipation of heat generated by the electronic components 30. The heatsink 10 is made up of metal material such as aluminum (Al) that has high thermal conductivity and heat dissipation. The heatsink 10 has a flat plate-like shape in a plane including the depth direction and the width direction. The heatsink 10 includes a body portion 11, fixing portions 12 projecting from the upper surface (surface in the upper direction) of the body portion 11 toward the substrate 20 side, screw holes 13, and recessed portions 14.

The fixing portion 12 is fixed in a state in which a base portion 41 of the fixing metal fitting 40 which will be described later is brought into contact. The fixing portion 12, as illustrated in FIG. 2, is configured in a quadrangular prism that is quadrangular when viewed from the vertical direction and is formed projecting toward the substrate 20 side. The fixing portions 12 in the present embodiment are formed on the body portion 11 side-by-side in the width direction. The fixing portion 12 is formed such that, in a state in which the substrate 20 and the heat dissipating sheets 60 are placed on the upper surface of the body portion 11, an upper surface 12a (surface in the upper direction, surface of the substrate 20 side) of the fixing portion 12 is higher than an upper surface 20a (surface in the upper direction) of the substrate 20. In the fixing portion 12, the screw hole 13 and a pair of recessed portions 14 are formed on the upper surface 12a. The screw hole 13 is a hole for fixing the fixing metal fitting 40 by the fastening member 50. The screw hole 13 in the present embodiment is formed in the central portion of the upper surface 12a when viewed from the vertical direction. The pair of recessed portions 14 is a portion to which projecting portions 44 fit. The projecting portions 44 are formed on the latter-described base portion 41 of the fixing metal fitting 40. The recessed portions 14 of a pair in the present embodiment are diagonally formed interposing the screw hole 13 therebetween.

The substrate 20 is a plate-like member for electrically coupling the electronic components 30. The substrate 20, as illustrated in FIG. 1, has a flat plate-like shape with the length of one side being longer than that of the fixing metal fitting 40 and equal to or less than the heatsink 10. In the substrate 20, a circuit pattern is implemented on the upper surface 20a that is formed on the upper direction side. In the substrate 20, the electronic components 30 are electrically coupled to the circuit pattern on the upper surface 20a by soldering. Out of the outer surfaces of the substrate 20, at least a portion that contacts the heatsink 10 is subjected to an insulation process. The substrate 20 includes through-holes 21 through which the fixing portions 12 penetrate in a state in which the substrate 20 is placed on the body portion 11. The through-holes 21 in the present embodiment correspond to the respective fixing portions 12, and the through-holes 21 are formed on the substrate 20 side-by-side in the width direction. Each of the through-holes 21 is configured in a quadrangular prism that is quadrangular when viewed from the vertical direction, and the through-hole 21 is formed to be larger than the corresponding fixing portion 12 so that the fixing portion 12 can penetrate through it when viewed from the vertical direction. The through-hole 21 is formed such that the length of one side is to be shorter than the length of a diagonal line of the fixing portion 12. The through-hole 21 is formed corresponding to the location of the fixing portion 12 and is formed between the electronic components 30 that are adjacent along the depth direction.

The electronic components 30 function as switching elements used for a switching power-supply device or the like, for example. The electronic components 30, as illustrated in FIG. 1, are each arranged interposing the through-hole 21 therebetween along the depth direction, in the upper surface 20a of the substrate 20. That is, one set of the electronic components 30 is installed with respect to each through-hole 21 in the substrate 20. Each of the electronic components 30 includes a body portion 31 and a terminal portion 32. As for the body portion 31, the outer circumference is formed of an insulating material. The terminal portion 32 is electrically coupled to the substrate 20 by soldering.

Each of the fixing metal fittings 40 is a metal fitting that presses and fixes the corresponding electronic components 30 to the substrate 20 and the heatsink 10 and that conducts the heat generated by the electronic components 30 to the heatsink 10. The fixing metal fitting 40 is made up of a metal material having thermal conductivity and heat dissipation and, for example, is manufactured by blanking from a plate material such as stainless steel and by folding. The fixing metal fitting 40, as illustrated in FIGS. 2 and 4, includes the base portion 41, a pair of pressing portions 42, a through-hole 43, and a pair of projecting portions 44.

The base portion 41 is formed to be smaller than the through-hole 21 of the substrate 20 when viewed from the vertical direction. The base portion 41, at the lower surface thereof (surface in the lower direction, surface on the fixing portion 12 side), contacts the upper surface 12a of the fixing portion 12 and is fixed to the heatsink 10 by the fastening member 50. The base portion 41 includes the through-hole 43 and a pair of projecting portions 44. The through-hole 43 is a hole that runs through the base portion 41 in the vertical direction and is a hole through which the fastening member 50 penetrates. The through-hole 43 corresponds to the screw hole 13, and is formed facing the corresponding screw hole 13 in the vertical direction. The pair of projecting portions 44 is formed on the lower surface of the base portion 41 that faces the upper surface 12a of the fixing portion 12. The pair of projecting portions 44 in the present embodiment is formed by punching out in the lower direction from the upper surface (surface in the upper direction) of the base portion 41. Each of the projecting portions 44 fits to the corresponding recessed portion 14 of the fixing portion 12, in a state in which the base portion 41 is placed on the fixing portion 12.

The pair of pressing portions 42 corresponds to one set of the electronic components 30 arrayed in the depth direction with respect to the substrate 20, extends from both end portions in the depth direction of the base portion 41 toward the electronic components 30, and has a flat plate-like shape. The pressing portion 42 includes a curved portion 42*a* that allows elastic deformation with respect to the base portion 41 and a contact portion 42*b* that contacts the body portion 31 of the electronic component 30. The curved portion 42*a* couples the base portion 41 and the contact portion 42*b*. The contact portion 42*b* contacts the upper surface of the body portion 12 in a state in which the fixing metal fitting 40 is fixed to the heatsink 10. The pressing portion 42, in a state in which the fixing metal fitting 40 is fixed to the heatsink 10, presses the electronic component 30 in the lower direction, and presses and fixes the electronic component 30 with respect to the substrate 20 and the heatsink 10.

The fastening member 50 fixes the fixing metal fitting 40 and the substrate 20 to the heatsink 10. The fastening member 50 is a screw for example, and a plurality of screws are provided corresponding to the respective screw holes 13. The fastening member 50 penetrates through the through-hole 43 of the fixing metal fitting 40 and is screwed into the screw hole 13, thereby fixing the fixing metal fitting 40 to the heatsink 10.

The pair of heat dissipating sheets 60 insulates the substrate 20 and the heatsink 10. The heat dissipating sheets 60 are made up of an insulation material of high thermal conductivity. The heat dissipating sheets 60, as illustrated in FIG. 2, face the electronic components 30 interposing the substrate 20 therebetween in the vertical direction. Each of the heat dissipating sheets 60 in the present embodiment is formed to be wider than the area for which the electronic components 30 arranged along the width direction are put together when viewed from the vertical direction. The heat dissipating sheets 60 of a pair are arranged interposing the fixing portion 12 therebetween along the depth direction. Each of the heat dissipating sheet 60 has a sheet-like shape having elasticity. The heat dissipating sheet 60 is affixed to the upper surface of the body portion 11 by the adhesion thereof or an adhesive not depicted.

An assembling procedure of the electronic component unit 1 will be described. First, the electronic components 30 are electrically coupled to the upper surface 20*a* of the substrate 20 by soldering. The electronic components 30 are mechanically held on the substrate 20 by being electrically coupled to the substrate 20.

Subsequently, the pair of heat dissipating sheets 60 is affixed on the upper surface of the body portion 11 of the heatsink 10. Then, the substrate 20 holding the electronic components 30 is placed on the heatsink 10 to which the heat dissipating sheets 60 are integrally combined. At this time, each of the fixing portions 12 of the heatsink 10 penetrates through the respective through-holes 21 of the substrate 20.

Then, the fixing metal fitting 40 is placed on the fixing portion 12 so that the projecting portions 44 that are formed on the base portion 41 fit to the recessed portions 14 that are formed on the fixing portion 12 of the heatsink 10. The lower surface of the base portion 41 and the upper surface 12*a* of the fixing portion 12 are brought into surface contact with each other in a state in which the screw hole 13 and the through-hole 43 face in the up-and-down direction. In the fixing metal fitting 40, as the projecting portions 44 fit to the recessed portions 14, the positioning of the base portion 41 with respect to the fixing portion 12 is made.

Then, the fastening member 50 penetrates through the through-hole 43 of the fixing metal fitting 40 and is screwed into the screw hole 13 of the fixing portion 12. In the screwing of the fastening member 50 to the screw hole 13, as the projecting portions 44 fit to the recessed portions 14, the fixing metal fitting 40 does not rotate about the fastening member 50 serving as the center. The substrate 20 does not rotate about the fastening members 50 serving as the center that penetrates through the through-hole 21 of the respective fixing portions 12. The contact portion 42*b* is brought into surface contact with the body portion 31 of the electronic component 30 and, as illustrated in FIG. 3, when the curved portion 42*a* receives reaction force in the upper direction against the force to press the electronic component 30 in the lower direction and elastically, the curved portion 42*a* deforms in the upper direction with respect to the base portion 41. Each of the pressing portions 42 of a pair elastically deforms substantially evenly with respect to the base portion 41. Then, the pressing portion 42 of the fixing metal fitting 40 completes the pressing and fixing of the respective electronic components 30 with respect to the substrate 20 and the heatsink 10.

According to the electronic component unit 1 in the above-described embodiment, because the fixing metal fitting 40 that is fixed to the fixing portion 12 penetrating through the through-hole 21 of the substrate 20 presses and fixes the electronic components 30 to the substrate 20, the degree of freedom in the arrangement of the electronic components 30 with respect to the substrate 20 increases. That is, if the through-hole 21 that the fixing portion 12 penetrates through can be formed on the substrate 20, because there is no need to arrange the electronic components 30 on the outer circumferential end portion side of the substrate 20, the degree of freedom in the arrangement of the electronic components 30 with respect to the substrate 20 increases. Furthermore, because the fixing metal fitting 40 presses the electronic components 30 toward the heatsink 10 and the substrate 20 in the lower direction, the electronic components 30 can be reliably fixed to the substrate 20 and the heatsink 10. As the pressing portion 42 presses the electronic component 30, the substrate 20, and the heat dissipating sheet 60 with respect to the heatsink 10, and because the foregoing adhere together more tightly, the heat generated by the electronic component 30 is easily conducted to the heatsink 10. As the base portion 41 of the fixing metal fitting 40 and the fixing portion 12 of the heatsink 10 come in contact, the heat generated by the electronic component 30 is easily conducted to the heatsink 10. Accordingly, the heat generated by the electronic component 30 can be efficiently dissipated.

As for the fixing metal fitting 40, because the pressing portions 42 of at least one set are formed interposing the base portion 41, even when the pressing portions 42 receives the reaction force in the upper direction against the force to press one set of the electronic component 30 in the lower direction, the pressing portions 42 elastically deform evenly with respect to the base portion 41. Accordingly, one set of the pressing portions 42 can press one set of the electronic components 30 to the substrate 20 with the even force, and the electronic components 30 can be reliably pressed and fixed to the substrate 20.

Because the projecting portions 44 or the recessed portions 14 are, at the locations where they fit each other, formed on the respective surfaces of the lower surface of the base portion 41 and the upper surface 12a of the fixing portion 12, the positioning of the fixing metal fitting 40 with respect to the fixing portion 12 is made easy when placing the fixing metal fitting 40 on the fixing portion 12. That is, because it only needs to place the recessed portions 14 and the projecting portions 44 at the location where they fit each other, the workability in assembling can be improved. Furthermore, when screwing the fastening member 50 into the fixing portion 12, because the fixing metal fitting 40 does not rotate about the fastening member 50 serving as the center as the projecting portions 44 fit to the recessed portions 14, the assembling workability can be improved.

Because the fixing portion 12 has a rotation regulating shape with respect to the substrate 20, the positioning is made easy as the substrate 20 does not rotate about the fixing portion 12 serving as the center when a worker places the substrate 20 on the heatsink 10. Accordingly, the assembling workability can be improved. Because the substrate 20 does not rotate about the fixing portion 12 serving as the center even after fixing the fixing metal fitting 40 to the fixing portion 12 by the fastening member 50, the electronic components 30 can be reliably fixed to the substrate 20.

Modifications of Embodiment

The electronic component unit 1 in the above-described embodiment is not limited to the illustration example. In the above-described embodiment, it has been described that the plurality of electronic components 30 are arranged on the substrate 20 and that the fixing metal fitting 40 includes a pair of pressing portions 42. However, the embodiment is not limited thereto. As for the fixing portion 12, the electronic component 30, the pressing portion 42, the fastening member 50, and the heat dissipating sheet 60, it only needs to have at least one each or more.

Furthermore, in the above-described embodiment, it has been described that two fixing portions 12 are formed. However, the fixing portion 12 of at least one or more only needs to be formed. In also a case where only one fixing portion 12 is formed, because the fixing portion 12 has a rotation regulating shape that can regulate the rotating of the substrate 20 about the fixing portion 12 serving as the center, the substrate 20 does not rotate about the fixing portion 12 serving as the center even when the substrate 20 is placed on the upper surface of the body portion 11. In the above-described embodiment, it has been described that the fixing portion 12 is configured in a quadrangular prism that is quadrangular when viewed from the vertical direction. However, it may be an elliptical cylinder or a polygonal prism when viewed from the vertical direction, and it only needs to be capable of regulating the rotating of the substrate 20 centering the fixing portion 12.

In the above-described embodiment, it has been described that the projecting portion 44 of the base portion 41 is punched out in the lower direction from the upper surface of the base portion 41. However, the embodiment is not limited thereto. For example, the projecting portions 44 may be formed by cutting and raising a part of the base portion 41.

In the above-described embodiment, it has been described that the pressing portion 42 of the fixing metal fitting 40 includes the curved portion 42a and the contact portion 42b. However, the embodiment is not limited thereto. The pressing portion 42 only needs to have a shape that is elastically deformable with respect to the base portion 41, and it may have no curved portion 42a. Although it has been described that the entire contact portion 42b contacts the head portion 31 of the electronic component 30, the embodiment is not limited thereto. The pressing portion 42 only needs to be capable of pressing and fixing the electronic component 30 to the substrate 20, and at least a part of the contact portion 42b only needs to contact the head portion 31.

In the above-described embodiment, it has been described that the fixing portion 12 is formed in a projecting manner such that the upper surface 12a of the fixing portion 12 of the heatsink 10 is higher than the upper surface 20a of the substrate 20 and the heat dissipating sheet 60 placed on the body portion 11. However, the embodiment is not limited thereto. The upper surface 12a of the fixing portion 12 may be formed at the height identical to or lower than the upper surface 20a of the substrate 20.

In the above-described embodiment, it has been described that the body portion 11 of the heatsink 10 has a flat plate-like shape. However, on the lower surface (surface in the lower direction) of the body portion 11, heat dissipating fins may be formed. By providing the lower surface of the body portion 11 with the heat dissipating fins, the heat dissipation can be performed more efficiently.

In the above-described embodiment, it has been described that the recessed portions 14 are formed on the upper surface 12a of the fixing portion 12 and the projecting portions 44 are formed on the lower surface of the base portion 41. However, the surfaces on which the recessed portions 14 and the projecting portions 44 are formed may be in reverse. That is, the projecting portions may be formed on the upper surface 12a of the fixing portion 12 and the recessed portions may be formed on the lower surface of the base portion 41. One each of the recessed portion and the projecting portion may be formed on the respective surfaces of the upper surface 12a of the fixing portion 12 and the lower surface of the base portion 41 such that the projecting portion fit to the recessed portion. In this case, not only the position of the fixing metal fitting 40 but also the arrangement direction can be uniquely determined. Accordingly, the assembling workability of the electronic component unit 1 can be improved. In the above-described embodiment, it has been described that the recessed portion 14 and the projecting portion 44 are formed to make a pair. However, the embodiment is not limited to one that pairs up the recessed portion 14 and the projecting portion 44, and at least one each or more of them only needs to be formed.

The fixing structure of electronic components according to the embodiment has an effect in that, because the arrangement of the electronic components to the substrate is not limited, the degree of freedom in layout of the electronic components to the substrate can be improved. In addition, it has an effect in that, because the fixing metal fitting presses the substrate and the electronic components against the heatsink, the electronic components can be reliably fixed to the substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A fixing structure of at least one electronic component, comprising:
   a heatsink;
   a substrate on which the at least one electronic component is disposed;
   a fixing metal fitting that fixes the at least one electronic component and the substrate to the heatsink; and a fastening member that fixes the fixing metal fitting to the heatsink, wherein the heatsink includes a body portion, and a fixing portion integrally formed on and inseparable from the body portion and projecting toward a substrate side and to which the fixing metal fitting is fixed, the fixing portion of the heat sink includes an opening to receive the fastening member, the substrate includes a through-hole through which the fixing portion penetrates in a state in which the substrate is placed on the body portion, the fixing metal fitting includes a base portion that contacts the fixing portion and is fixed to the fixing portion by the fastening member, and a pressing portion that extends from one end of the base portion, elastically deforms with respect to the base portion, and presses the at least one electronic component toward the substrate side, and out of a surface on the base portion side of the fixing portion and a surface on the fixing portion side of the base portion, a projecting portion is formed on either one of the surfaces and a recessed portion to which the projecting portion fits is formed on the other surface.

2. The fixing structure of the electronic component according to claim 1, wherein the at least one electronic component includes at least one set of electronic components corresponding to the through-hole in the substrate, and the pressing portion includes a set of pressing portions corresponding to the at least one set of electronic components.

3. The fixing structure of the electronic component according to claim 1, wherein the fixing portion has a rotation regulating shape that regulates rotation of the substrate with respect to the fixing portion, in a state in which the through-hole is penetrated.

4. The fixing structure of the electronic component according to claim 2, wherein the fixing portion has a rotation regulating shape that regulates rotation of the substrate with respect to the fixing portion, in a state in which the through-hole is penetrated.

5. The fixing structure of the electronic component according to claim 1, wherein the base portion of the fixing metal fitting directly contacts the fixing portion.

6. The fixing structure of the electronic component according to claim 2, wherein the base portion of the fixing metal fitting directly contacts the fixing portion.

7. A fixing structure of at least one electronic component, comprising:

a heatsink;

a substrate on which the at least one electronic component is disposed;

a fixing metal fitting that fixes the at least one electronic component and the substrate to the heatsink; and a fastening member that fixes the fixing metal fitting to the heatsink, wherein the heatsink includes a body portion, and a fixing portion integrally formed on and inseparable from the body portion and projecting toward a substrate side and to which the fixing metal fitting is fixed, the fixing portion of the heat sink includes an opening to receive the fastening member, the substrate includes a through-hole through which the fixing portion penetrates in a state in which the substrate is placed on the body portion, and the fixing metal fitting includes a base portion and a pressing portion that extends from one end of the base portion, wherein the base portion comprises a first opening and the fixing portion comprises a second opening, wherein the fastening member is provided through the first opening and the second opening to fix the fixing metal fitting to the heatsink, wherein the pressing portion presses the at least one electronic component toward the substrate side, and out of a surface on the base portion side of the fixing portion and a surface on the fixing portion side of the base portion, a projecting portion is formed on either one of the surfaces and a recessed portion to which the projecting portion fits is formed on the other surface.

* * * * *